(12) United States Patent
Pass

(10) Patent No.: US 9,997,651 B2
(45) Date of Patent: Jun. 12, 2018

(54) DAMAGE BUFFER FOR SOLAR CELL METALLIZATION

(71) Applicant: SUNPOWER CORPORATION, San Jose, CA (US)

(72) Inventor: Thomas P. Pass, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 116 days.

(21) Appl. No.: 14/626,769

(22) Filed: Feb. 19, 2015

(65) Prior Publication Data

US 2016/0247948 A1    Aug. 25, 2016

(51) Int. Cl.

| | |
|---|---|
| *H01L 27/14* | (2006.01) |
| *H01L 31/0203* | (2014.01) |
| *H01L 31/0224* | (2006.01) |
| *H01L 31/18* | (2006.01) |
| *H01L 31/0216* | (2014.01) |
| *H01L 31/05* | (2014.01) |
| *H01L 31/068* | (2012.01) |

(52) U.S. Cl.
CPC ........... *H01L 31/022441* (2013.01); *H01L 31/02167* (2013.01); *H01L 31/0504* (2013.01); *H01L 31/0682* (2013.01); *H01L 31/18* (2013.01); *Y02E 10/547* (2013.01)

(58) Field of Classification Search
CPC ............ H01L 31/022441; H01L 31/18; H01L 31/02167; H01L 31/0504; H01L 31/0682; Y02E 10/547
USPC ................................................. 257/431, 434
See application file for complete search history.

(56) References Cited

U.S. PATENT DOCUMENTS

| | | | | |
|---|---|---|---|---|
| 5,554,488 | A | * | 9/1996 | Rioux ..................... G03F 7/092 216/47 |
| 6,423,568 | B1 | * | 7/2002 | Verlinden ....... H01L 31/022441 136/244 |
| 7,339,110 | B1 | * | 3/2008 | Mulligan ........ H01L 31/022441 136/256 |
| 9,437,456 | B2 | | 9/2016 | Pass |
| 2008/0216887 | A1 | | 9/2008 | Hacke et al. |
| 2010/0307575 | A1 | | 12/2010 | Kim et al. |
| 2012/0103408 | A1 | | 5/2012 | Moslehi et al. |
| 2012/0204938 | A1 | | 8/2012 | Hacke et al. |
| 2014/0174519 | A1 | | 6/2014 | Rim et al. |
| 2014/0202528 | A1 | * | 7/2014 | Yang ................. B32B 17/10036 136/256 |

(Continued)

FOREIGN PATENT DOCUMENTS

| | | |
|---|---|---|
| DE | 102004050269 A1 | 4/2006 |
| KR | 1020110056653 | 5/2011 |
| WO | WO-2014209532 | 12/2014 |

OTHER PUBLICATIONS

International Search Report and Written Opinion from PCT/US2016/016229 dated Jun. 9, 2016, 14 pgs.

(Continued)

*Primary Examiner* — Duy T Nguyen
(74) *Attorney, Agent, or Firm* — Schwabe, Williamson & Wyatt, P.C.

(57) ABSTRACT

A solar cell structure includes a semiconductor region disposed in or above a substrate. A damage buffer can be disposed above the semiconductor region. First and second conductive layers can be bonded together at a location above the damage buffer.

16 Claims, 5 Drawing Sheets

(56) References Cited

U.S. PATENT DOCUMENTS

2016/0343888 A1    11/2016  Pass

OTHER PUBLICATIONS

Extended European Search Report in European Patent Application No. 16752787.8 dated Dec. 14, 2017, 6 pages.

* cited by examiner

DAMAGE BUFFER FOR SOLAR CELL METALLIZATION

BACKGROUND

Photovoltaic cells, also known as solar cells, are devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not drawn to scale.

DETAILED DESCRIPTION

Figure 1:
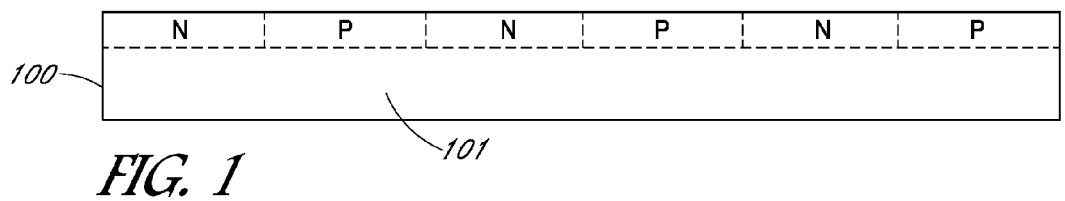
FIGS. 1-7 are cross-sectional views that schematically illustrate a method of fabricating a solar cell in accordance with an embodiment of the present disclosure.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" portion of a conductive foil does not necessarily imply that this portion is the first portion in a sequence; instead the term "first" is used to differentiate this portion from another portion (e.g., a "second" portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although many of the examples described herein are back contact solar cells, the techniques and structures apply equally to other (e.g., front contact) solar cells as well. Moreover, although much of the disclosure is described in terms of solar cells for ease of understanding, the disclosed techniques and structures apply equally to other semiconductor structures (e.g., silicon wafers generally).

Solar cells and methods of forming solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography techniques, are not described in detail in order to not unnecessarily obscure embodiments of the present disclosure. Furthermore, it is to be understood that the various embodiments shown in the figures are illustrative representations and are not necessarily drawn to scale.

Turning now to the Figures, FIGS. 1-7 are cross-sectional views that schematically illustrate a method of fabricating a solar cell in accordance with an embodiment of the present disclosure. The example solar cell in FIGS. 1-7 is an all back contact solar cell in that the N-type and P-type doped regions and the metal fingers coupled to the N-type and P-type doped regions are on the backside of the solar cell, which is opposite the front, light receiving side in a typical installation.

Referring first to FIG. 1, solar cell structure 100 is illustrated in accordance with an embodiment of the present disclosure. In the example of FIG. 1, solar cell structure 100 includes a semiconductor region, for example, alternating N-type doped regions and P-type doped regions that can be formed in solar cell substrate 101 or external to solar cell substrate 101. For example, the N-type and P-type doped regions may be formed by diffusing N-type and P-type dopants, respectively, into solar cell substrate 101. In another example, the N-type and P-type doped regions are formed in a separate layer of material, such as polysilicon, that is formed above solar cell substrate 101. In that example, N-type and P-type dopants are diffused into the polysilicon to form N-type and P-type doped regions in the polysilicon (which may or may not have a trench separating the N-type and P-type doped regions), instead of in solar cell substrate 101. Solar cell substrate 101 may comprise a monocrystalline silicon wafer (e.g., an n-type doped monocrystalline silicon substrate), for example. Not shown, a dielectric, such as a tunnel oxide may be disposed on the substrate and under the polysilicon.

In the example of FIG. 1, the labels "N" and "P" schematically represent the N-type and P-type doped regions or electrical connections to the N-type and P-type doped regions. More particularly, the labels "N" schematically represent exposed N-type doped regions or exposed metal connections to the N-type doped regions. Similarly, the labels "P" schematically represent exposed P-type doped regions or exposed metal connections to the P-type doped regions. Solar cell structure 100 may thus represent the structure of a solar cell being fabricated after contact holes to the N-type and P-type doped regions have been formed, but before the metallization process to form metal contact fingers to the N-type and P-type doped regions. For example, contact holes can be formed in a dielectric layer (e.g., silicon dioxide) disposed on the silicon substrate such that the metallization can reach the doped regions through the contact holes.

In the example of FIG. 1, the N-type and P-type doped regions are on the backside of solar cell structure 100, with the backside of solar cell structure 100 being opposite the front side, which is directed towards the sun to collect solar radiation during normal operation.

Figure 2:
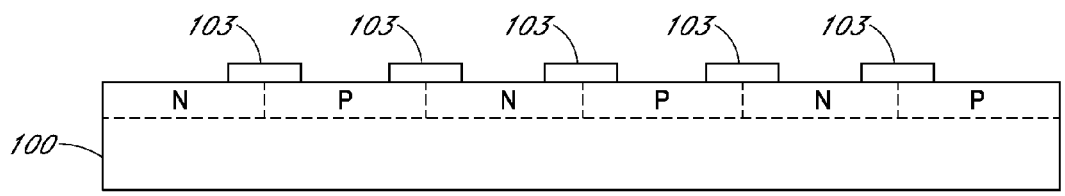

Referring next to FIG. 2, in some embodiments, a plurality of damage buffers 103 can be formed on or above the surface of the solar cell structure 100. In one embodiment, damage buffers can be formed on a dielectric layer on the substrate. In the example of FIG. 2, damage buffers 103 can be formed in alignment with locations between respective ones of adjacent P-type and N-type doped regions.

As can be appreciated, damage buffers can also be formed on other regions depending on the particulars of the solar cell structure 100. For example, as shown in FIG. 8, damage buffers 111 can be formed in alignment with the P-type and N-type doped regions and damage buffers 103 can be formed in alignment with locations between the P-type and N-type doped regions. In the example of FIG. 8, separate damage buffers can be used for inhibiting damage from bonding/welding (e.g., damage buffers 111, also referred to as weld damage buffers) and for inhibiting damage from patterning (e.g., damage buffers 103, also referred to as pattern damage buffers). Although the separate damage buffers in FIG. 8 are illustrated with a gap separating them, in other embodiments, the separate damage buffers can abut one another (and appear similar to the monolithic structure illustrated in FIG. 2-7) or at least partially overlap. In other embodiments, as shown in FIGS. 2-7, the damage buffers can be wide enough to inhibit damage from both bonding and patterning such that separate weld and pattern damage buffers may not be needed.

In one embodiment, damage buffers 103 (and/or 111) can be printed (e.g., screen printed) or otherwise formed on solar cell structure 100. For example, the damage buffers can alternatively be formed by spin coating or by deposition (e.g., chemical vapor deposition) followed by patterning (e.g., masking and etching). In some embodiments, the damage buffers can include a dielectric material with optical absorbers, a fineable dielectric, etc., or reflectors. As a particular example, the damage buffers can comprise polyimide (e.g., with titanium oxide filters) that is screen printed on the solar cell structure 100 to a thickness of 1-10 microns. Generally speaking, the damage buffers can have a thickness and composition that can inhibit (e.g., by absorption or reflection) damage to solar cell structures that are underneath metal contact layers (e.g., doped regions, dielectric(s), trench, silicon substrate, etc.) from a laser or other tool employed in the bonding (e.g., welding) of conductive foil 105 to conductive layer 104 or in the patterning of the conductive foil 105 and/or conductive layer 104 (see FIGS. 6-7).

As described in more detail later, in embodiments in which separate damage buffers are used to inhibit damage from welding than the damage buffers used to inhibit damage from patterning, the composition, thickness, and/or other properties of the weld damage buffers may be different than that of the pattern damage buffers, for example, to account for the possibility of different properties (e.g., duration, pulse, wavelength) of the welding and patterning processes.

In the example of FIG. 2, damage buffers 103 are disposed in alignment with locations between respective ones of the alternating N-type and P-type of the solar cell structure 100. As will be more apparent below, in a subsequent metallization process, a conductive foil can be bonded to another conductive layer at locations above damage buffers such that the damage buffer can inhibit damage to the underlying structures beneath the damage buffer. Additionally, in some embodiments, the conductive foil and conductive layer can be patterned at locations above damage buffers (whether the same damage buffer underneath the weld joints or a different damage buffer just for patterning). As noted above and described in more detail at FIG. 8, separate bond and pattern damage buffers can be used in some embodiments. Moreover, in some embodiments, the bond damage buffers can include a different composition of materials, a different thickness, or be formed in a different and/or separate process than the pattern damage buffers. In various embodiments, the damage buffers can advantageously inhibit damage from the bonding and patterning process (e.g., from a laser beam) that could otherwise damage pre-metal structures of the solar cell.

Figure 3:
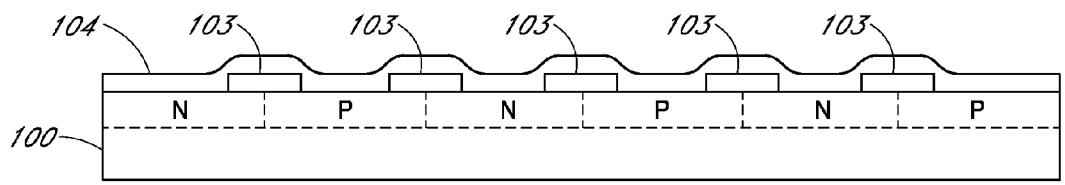

As shown in FIG. 3, a conductive layer 104 can be formed on the solar cell structure 100. Conductive layer 104 can provide electrical connection to the N-type and P-type doped regions for the subsequently formed conductive contacts, also referred to as metal fingers.

In one embodiment, conductive layer 104 comprises a continuous blanket metal coating that is conformal over the damage buffers 103 and/or 111. For example, the conductive layer 104 may include one or more of aluminum, aluminum-silicon alloy, tin, nickel, copper, conductive carbon, or silver, among other examples, and may be formed on the damage buffers 103 and/or 111, the N-type doped regions, and the P-type doped regions by sputtering, deposition, or some other process to a thickness of 100 Angstroms to 10 microns (e.g., 0.3 micron to 2 microns). Generally speaking, the conductive layer 104 comprises a material that can be bonded to conductive foil 105 and also adhere well to the emitter regions that include the N-type or P-type doped regions. For example, the conductive layer 104 may comprise aluminum to facilitate welding to an aluminum conductive foil 105. As described herein at FIG. 7, metal layer 104 and/or conductive foil 105 can subsequently be patterned to separate the N-type doped regions from the P-type doped regions during patterning of conductive foil 105.

Although referred to as a layer, in some examples, the conductive layer may not be a continuous layer on the previously formed solar cell structures. For instance, the conductive layer may be formed in a pattern, such as a finger pattern (e.g., interdigitated finger pattern). In various embodiments, the conductive layer can be printed in the pattern, or deposited then patterned (e.g., masked and etched). In various embodiments, though, if the conductive layer is not pre-patterned (e.g., printed in the desired pattern), the disclosed techniques can save processing steps by patterning the conductive layer and conductive foil in the same processing step as described in more detail at FIG. 7.

Figure 4:
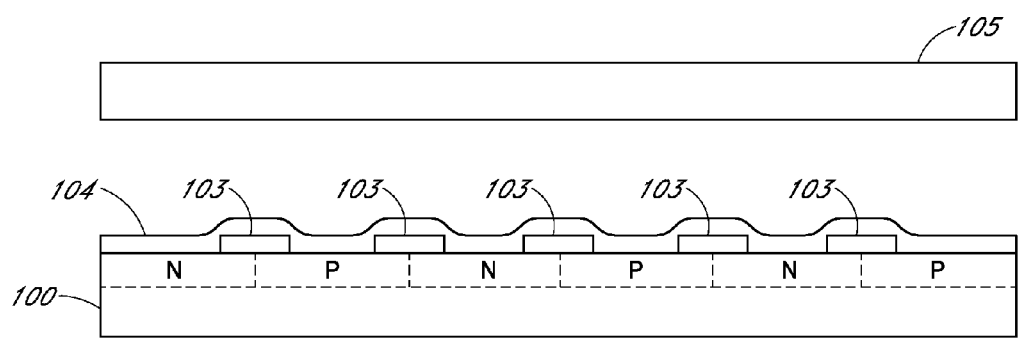

Referring next to FIG. 4, conductive foil 105 is roughly located above solar cell structure 100. In one embodiment, conductive foil 105 comprises a pre-fabricated thin (e.g., 12 to 50 microns) sheet of metal, such as aluminum or aluminum alloy.

Figure 5:
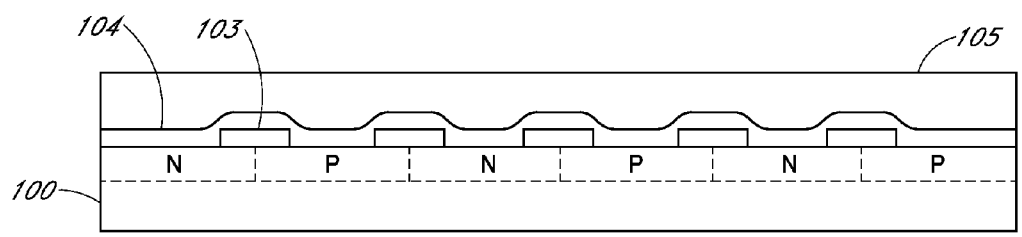

Continuing in FIG. 5, metal foil 105 is placed on solar cell structure 100. Unlike metal that is deposited or coated on the solar cell structure 100, conductive foil 105 is a pre-fabricated sheet. In one embodiment, conductive foil 105 comprises a sheet of aluminum. Conductive foil 105 is placed on solar cell structure 100 in that it is not formed on solar cell structure 100. In one embodiment, conductive foil 105 is placed on solar cell structure 100 by fitting to conductive layer 104. The fitting process may include pressing conductive foil 105 to conductive layer 104 such that conductive foil 105 makes intimate contact with conductive layer 104. The fitting process may result in conductive foil 105 being conformal over features (e.g., bumps) of conductive layer 104. A vacuum, forced air, mechanical press, or other mechanism may be used to press conductive foil 105 against conductive layer 104 to obtain a gap of less than 10 microns between them during welding.

Figure 6:
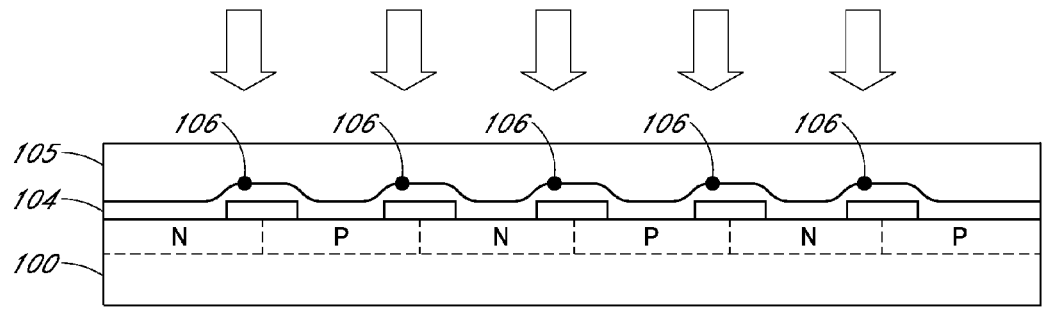

FIG. 6 shows solar cell structure 100 after conductive foil 105 is electrically bonded to conductive layer 104. In the example of FIG. 6, conductive foil 105 is welded to conductive layer 104 at locations over damage buffers (e.g., damage buffer 103 of FIG. 6 or weld damage buffer 111 of FIG. 8) by directing a laser beam (e.g., infrared laser) on conductive foil 105 while conductive foil 105 is pressed against conductive layer 104. The laser welding process creates weld joints 106 that electrically bond conductive foil 105 to conductive layer 104. Because conductive foil 105 is unpatterned at this stage of the fabrication process, conductive foil 105 still electrically connects the N-type and P-type doped regions of solar cell structure 100.

By forming the bond from the conductive foil to the conductive layer at a location over a damage buffer, optical and/or mechanical damage to pre-metal structures can be inhibited.

Figure 7:
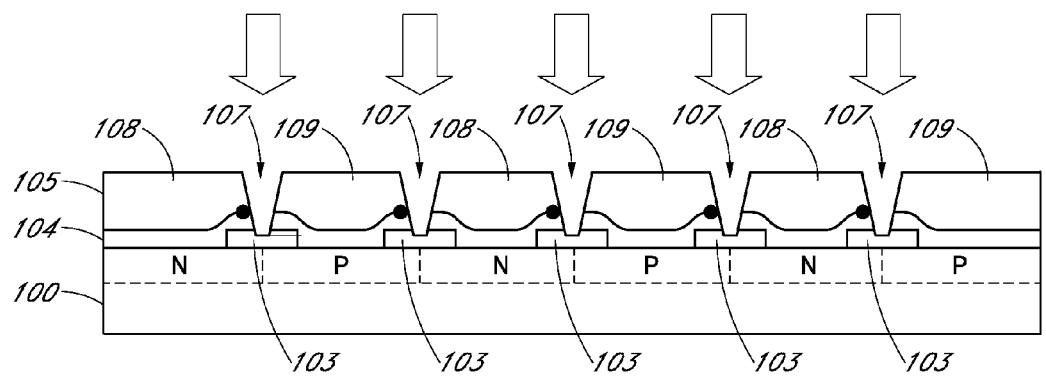
Figure 8:
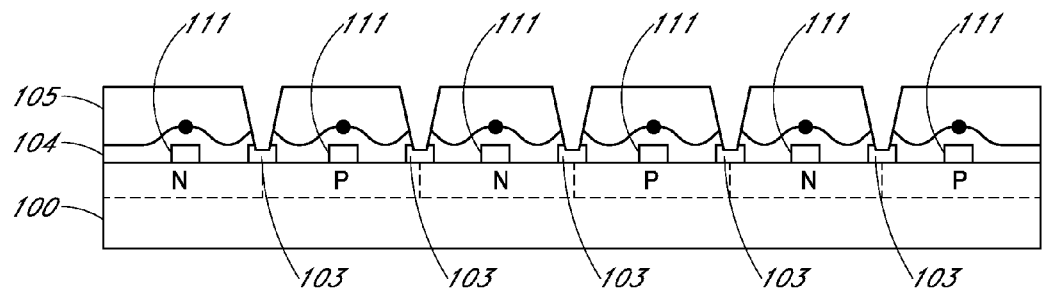
FIG. 8 is a cross-sectional view of a solar cell, according to various embodiments.

Continuing in FIG. 7, conductive foil 105 is patterned to form metal fingers 108 and 109. In one embodiment, conductive foil 105 is patterned by ablating portions of conductive foil 105 and conductive layer 104 (if conductive layer 104 is not already patterned) that are over damage buffers 103. In one embodiment, conductive foil 105 and conductive layer 104 may be ablated using a laser beam, which may be a different laser tool, or different laser configurations than the welding laser. For example, in one embodiment, the welding may be performed using an infrared laser beam whereas the patterning may be performed using an ultraviolet laser beam. The laser ablation process may cut (see 107) conductive foil 105 into at least two separate pieces, with one piece being a metal finger 108 that is electrically connected to the N-type doped regions and another piece being a metal finger 109 that is electrically connected to the P-type doped regions. The laser ablation process can break the electrical connection of the N-type and P-type doped regions through conductive layer 104 and conductive foil 105. In embodiments in which the conductive layer is not already patterned before the conductive foil is placed on it, conductive foil 105 and conductive layer 104 can be patterned in the same step, which can advantageously reduce fabrication costs.

In some embodiments, the laser ablation process uses a laser beam that cuts conductive foil 105 and conductive layer 104 all the way through. Depending on the process window of the laser ablation process, the laser beam may also cut portions of, but not through, damage buffer 103. Damage buffers 103 can advantageously block or inhibit laser beams that may otherwise reach and damage solar cell structure 100, such as pre-metal structures (e.g., doped regions, passivation layers, oxides, substrate, etc.). Damage buffers 103 can also advantageously protect solar cell structure 100 from mechanical damage, such as during fitting of conductive foil 105 to conductive layer 104. Damage buffers 103 (and damage buffers 111 if used) can be left in the completed solar cell, so their use does not necessarily involve an additional removal step after patterning of conductive foil 105.

Turning now to FIG. 8, a cross-sectional view of another example solar cell is shown. In the example of FIG. 8, different damage buffers are used for patterning than are used for welding. As shown, weld damage buffers 111 and pattern damage buffers 103 can inhibit damage to pre-metal structures during the welding and patterning processes, respectively. As noted above, weld damage buffers 111 can include materials, thickness, shape, or other properties that are designed to be more robust to the weld laser (e.g., infrared wavelength, pulse duration, etc.). Similarly, pattern damage buffers 103 can include materials, thickness, shape, or other properties that are designed to be more robust to the patterning laser (e.g., ultraviolet, pulse duration, etc.).

In light of the foregoing, one of ordinary skill in the art will appreciate that embodiments of the present disclosure provide additional advantages heretofore unrealized. Use of metal foils to form metal fingers is relatively cost-effective compared to metallization processes that involve deposition or plating of the metal fingers. The damage buffers can allow for a laser welding process and a laser ablation process to be performed in-situ, i.e., one after another in the same processing station. The damage buffers can also enable use of one or more laser beams to weld conductive foil 105 to conductive layer 104 and to pattern conductive foil 105 while conductive foil 105 is on solar cell structure 100. Moreover, unlike etching and other chemical based patterning processes, patterning the metal foil 105 using a laser minimizes the amount of residue that may form on the solar cell being fabricated, residue which can impact lifetime, reliability, and efficiency.

Figure 9:
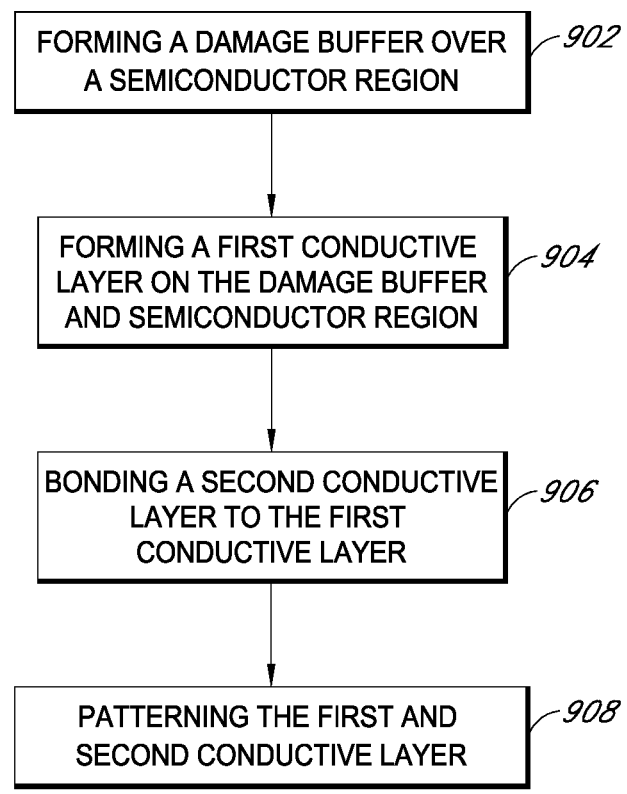
FIG. 9 is a flow diagram of a method of fabricating a solar cell in accordance with an embodiment of the present disclosure.

Turning now to FIG. 9, a flow chart illustrating a method for fabricating a solar cell is shown, according to some embodiments. In various embodiments, the method of FIG. 9 may include additional (or fewer) blocks than illustrated. For example, in some embodiments, separate weld and pattern damage buffers may be formed instead of forming damage buffers that are wide enough to serve as both weld and pattern damage buffers.

In various embodiments, the method of FIG. 9 may be performed on a solar cell structure with N-type and P-type doped regions. The method of FIG. 9 may be performed at the cell level during fabrication of the solar cell or at the module level when the solar cell is connected and packaged with other solar cells.

At 902, one or more damage buffers (e.g., weld damage buffers) can be formed over a semiconductor region, disposed in or above a substrate of a solar cell structure. In some embodiments, each of the weld damage buffers can be formed over an N-type doped region or over a P-type doped region of the solar cell structure, respectively. In embodiments in which a single damage buffer is wide enough to serve as a weld and pattern damage buffer, the damage buffer can be formed in alignment with a region between respective N-type and P-type doped regions and also partially overlap the N-type or P-type doped region.

As described herein, in some embodiments, separate bond/weld damage buffers and pattern damage buffers can be used. In such embodiments, both the weld and pattern damage buffers can be formed over the semiconductor region, with the weld damage buffers disposed over respective P-type or N-type doped regions and with the pattern damage buffers being disposed in alignment with or otherwise over the region between P-type and N-type doped regions. As noted above, in some embodiments, there may not be a gap between separate bond/weld and pattern damage buffers. Instead, in such embodiments, the bond/weld damage buffers can abut and/or at least partially overlap an adjacent pattern damage buffer.

In various embodiments, the damage buffers can be formed by screen printing, spin coating, or by deposition and patterning, for example. The damage buffers can be performed in a single step or sequentially. For example, in some embodiments, the weld damage buffers and pattern damage buffers can differ in at least one respect, such as composition of materials, thickness, etc. Accordingly, depending on the properties (e.g., composition, thickness) of the desired damage buffer, a different forming technique can be used. For instance, for one type of damage buffer (e.g., weld), screen printing may work better than deposition and patterning, whereas for a different type of damage buffer (e.g., pattern), the opposite may be true. Or, as another example, both the weld and pattern damage buffers may be screen printed, just with a different composition of materials and/or thickness. In such an example, the weld and pattern damage buffers may be formed sequentially or simultaneously depending on the particular tool.

At 904, a conductive layer (e.g., metal layer, which can include aluminum, nickel, copper, silver, tin, among other examples) can be formed on the damage buffers and on the surface of the solar cell structure that is exposed between the damage buffers. In one embodiment, the conductive layer is a continuous and conformal layer that is formed by blanket deposition. In other embodiments, the conductive layer is formed in a pattern, such as in a finger pattern. Forming the conductive layer in a pattern can be performed by printing, among other examples.

At 906, a conductive foil (e.g., metal foil, such as aluminum foil, among other examples) is bonded to the conductive layer at locations above weld damage buffers (or above common damage buffers if wide damage buffers are used for both weld and pattern damage buffering). In one embodiment, the conductive foil is welded to the metal layer using a laser beam, such as an infrared laser. It is to be noted that non-laser based welding or other techniques may also be employed to bond the conductive foil to the conductive layer.

As shown at 908, the conductive foil and conductive layer, if the conductive layer is not already patterned, can be patterned. In one embodiment, a laser beam can be used to ablate portions of the conductive foil and the conductive layer that are over the pattern damage buffer (or over the common damage buffer). The laser ablation process patterns the conductive foil into separate conductive fingers (e.g., interdigitated fingers), and can also pattern the conductive layer to separate the P-type and N-type doped regions.

Figure 10:
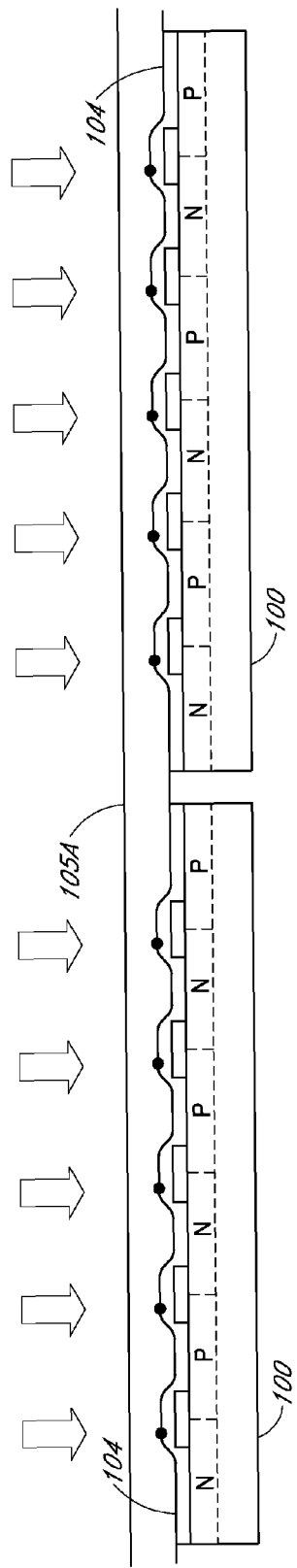
FIGS. 10 and 11 are cross-sectional views that schematically illustrate patterning of a metal foil at the module level, in accordance with an embodiment of the present disclosure.

In some embodiments, patterning the conductive foil can be performed at the module level when the solar cell is packaged with other solar cells. In that example, conductive foil 105 can be fitted to conductive layers 104 of a plurality of solar cell structures 100. This is schematically illustrated in FIG. 10, where conductive foil 105A is fitted to conductive layers 104 of two or more solar cell structures 100. Conductive foil 105A is the same as the previously discussed conductive foil 105 except that the conductive foil 105A spans more than one solar cell structure 100. As described herein, the conductive foil can be bonded to the conductive layers of the two solar cells at locations above weld damage buffers.

Figure 11:
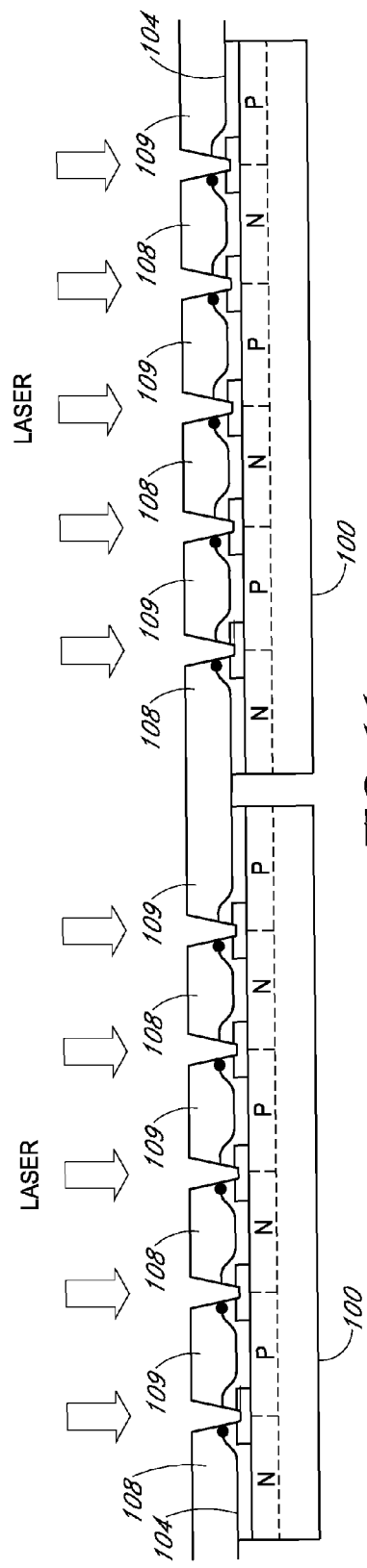

As shown in FIG. 11, conductive foil 105A can be patterned by laser ablation while on solar cell structures 100. The laser ablation process can pattern conductive foil 105A into conductive fingers 108 and 109 as described herein. In some embodiments, conductive foil 105A can be cut after patterning to physically separate the solar cell structures 100. After patterning, portions of the metal foil 105A may also be left in place to string together adjacent solar cell structures 100.

In one embodiment, the laser ablation of the conductive foil 105A leaves a connection between opposite type metal fingers of adjacent solar cell structures 100. This is schematically illustrated in the example of FIG. 11, where conductive foil 105 is patterned such that a P-type metal finger 109 of one solar cell structure 100 is left connected to the N-type metal finger 108 of an adjacent solar cell structure 100, thereby electrically connecting the solar cell structures 100 in series. This can advantageously save fabrication steps at the module level because the patterning of conductive foil 105A can be combined with the stringing of the solar cell structures 100.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a substrate;
   a semiconductor region disposed in or above the substrate;
   a first damage buffer disposed above the semiconductor region;
   a first conductive layer disposed above the first damage buffer; and
   a second conductive layer disposed above the first conductive layer, wherein the first and second conductive layers are bonded together at a first location above the first damage buffer, wherein the first and second conductive layers have substantially co-planar sidewalls over the first damage buffer, wherein the substantially co-planar sidewalls are sloped relative to the substrate, and wherein the first damage buffer has a recessed portion therein, the recessed portion having sidewalls substantially co-planar with the sloped sidewalls of the first and second conductive layers over the first damage buffer.

2. The solar cell of claim 1, wherein the first and second conductive layers are bonded together by a weld joint at the first location.

3. The solar cell of claim 1, wherein a first portion of the bonded first and second conductive layers is separated from a second portion of the bonded first and second conductive layers at a second location above the first damage buffer.

4. The solar cell of claim 1, further comprising a second damage buffer disposed above the semiconductor region.

5. The solar cell of claim 4, wherein a first portion of the bonded first and second conductive layers is separated from a second portion of the bonded first and second conductive layers at the first location above the second damage buffer.

6. The solar cell of claim 4, wherein the first and second conductive layers further comprise a bond at the first location above the second damage buffer.

7. The solar cell of claim 4, wherein the second damage buffer includes a different composition of materials or a different thickness than the first damage buffer.

8. The solar cell of claim 1, wherein the semiconductor region includes alternating N-type and P-type semiconductor regions, wherein the first damage buffer is disposed in alignment with a location between the respective ones of the alternating N-type and P-type semiconductor regions.

9. A solar cell, comprising:
   a substrate;
   a semiconductor region disposed in or above the substrate;
   a first damage buffer disposed above the semiconductor region;
   a metal seed layer disposed above the first damage buffer; and
   a metal foil layer disposed above the metal seed layer, wherein the metal foil and metal seed layers are bonded together at a first location above the first damage buffer, wherein the metal foil and metal seed layers have substantially co-planar sidewalls over the first damage buffer, wherein the substantially co-planar sidewalls are sloped relative to the substrate, and wherein the first damage buffer has a recessed portion therein, the recessed portion having sidewalls substantially co-planar with the sloped sidewalls of the metal foil and metal seed layers over the first damage buffer.

10. The solar cell of claim 9, wherein the metal foil and metal seed layers are bonded together by a weld joint at the first location.

11. The solar cell of claim 9, wherein a first portion of the bonded metal foil and metal seed layers is separated from a second portion of the bonded metal foil and metal seed layers at a second location above the first damage buffer.

12. The solar cell of claim 9, further comprising a second damage buffer disposed above the semiconductor region.

13. The solar cell of claim 12, wherein a first portion of the bonded metal foil and metal seed layers is separated from a second portion of the bonded metal foil and metal seed layers at the first location above the second damage buffer.

14. The solar cell of claim 12, wherein the metal foil and metal seed layers further comprise a bond at the first location above the second damage buffer.

15. The solar cell of claim 12, wherein the second damage buffer includes a different composition of materials or a different thickness than the first damage buffer.

16. The solar cell of claim 9, wherein the semiconductor region includes alternating N-type and P-type semiconductor regions, wherein the first damage buffer is disposed in alignment with a location between the respective ones of the alternating N-type and P-type semiconductor regions.

* * * * *